United States Patent [19]

Sasaki

[11] Patent Number: 4,812,776
[45] Date of Patent: Mar. 14, 1989

[54] SYSTEM FOR AMPLIFYING AND SHAPING OPTICAL PULSES

[75] Inventor: Shinya Sasaki, Kodaira, Japan

[73] Assignee: Hitachi, Ltd., Tokyo, Japan

[21] Appl. No.: 833,040

[22] Filed: Feb. 26, 1986

[30] Foreign Application Priority Data

Mar. 4, 1985 [JP] Japan .................................. 60-41324

[51] Int. Cl.$^4$ ............................................. H01S 3/103
[52] U.S. Cl. ...................................... 330/4.3; 372/25; 372/30; 357/17
[58] Field of Search ...................... 330/4.3; 332/7.51; 372/21, 25, 26, 30, 31, 46, 50; 357/16, 17

[56] References Cited

U.S. PATENT DOCUMENTS

| | | | |
|---|---|---|---|
| 3,585,520 | 6/1971 | Yanai et al. | 332/7.51 X |
| 3,723,903 | 3/1973 | Paoli et al. | 332/7.51 X |
| 3,815,045 | 6/1974 | Ito | 332/7.51 X |
| 3,887,876 | 6/1975 | Zeidler | 332/7.51 X |
| 4,038,610 | 7/1977 | Nishizawa et al. | 330/4.3 X |
| 4,065,729 | 12/1977 | Gover et al. | 372/50 |
| 4,196,396 | 4/1980 | Smith | 330/4.3 |
| 4,484,144 | 11/1984 | Nakagome et al. | 330/4.3 |
| 4,518,934 | 5/1985 | Venkatesan | 332/7.51 |
| 4,562,569 | 12/1985 | Yariv et al. | 372/46 X |

OTHER PUBLICATIONS

Harder et al., "Bistability and Pulsations in Semiconductor Lasers with Inhomogeneous Current Injection", 9/82, pp. 1351–1361, Journal of Quantum Electronics.

Primary Examiner—Thomas H. Tarcza
Assistant Examiner—Mark Hellner
Attorney, Agent, or Firm—Antonelli, Terry & Wands

[57] ABSTRACT

A bistable laser for realizing a waveshaping function, having a drive current which during normalcy biases the bistable laser to the middle point of the hysteresis region thereof. When input light exceeds a threshold level, the bistable laser is switched into the lasing state, and even when the input light thereafter disappears, the laser emits light of fixed intensity. A detector having detected this lasing state decreases the drive current temporarily after a predetermined period of time, to switch the bistable laser into the non-lasing state, whereby not only the amplification but also the shaping of an optical pulse signal is achieved.

2 Claims, 3 Drawing Sheets

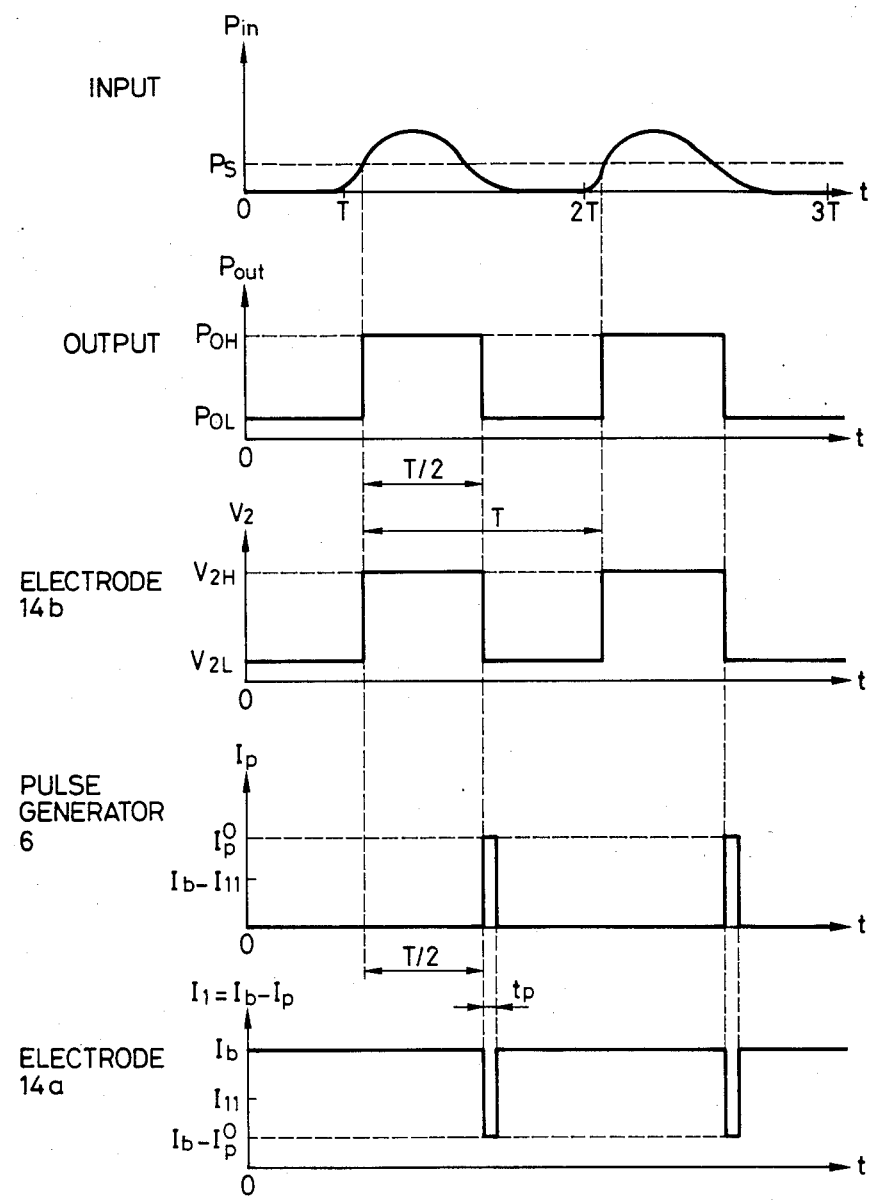

SYSTEM FOR AMPLIFYING AND SHAPING OPTICAL PULSES

BACKGROUND OF THE INVENTION

The present invention relates to a system for amplifying and shaping optical pulses without converting them into electric signals. Such a system is useful as, for example, an optical repeated optical communication system.

One of technical fields requiring the amplification and shaping of optical pulses is optical communication. In optical communication, especially in an optical communication system employing optical fibers as transmission media, a long transmission distance subjects optical signals to great attenuations and waveform distortion. In order to cope with this drawback, it is common practice that optical repeaters are disposed at suitable intervals so as to compensate for the attenuations and waveform distortions of optical signals. The optical repeaters include two types. The first type converts an optical signal into an electric signal, then processes the electric signal, and converts the processed signal back into an optical signal (refer to 'Hikari Tsushin' [Optical Communication] edited by Seiji Ōhara and Tatsuya Kimura, published by Corona Pubishing Co., Ltd. in 1981, pp. 222-223). This first type of repeater comprises an optical detector which converts an arriving optical signal into an electric signal, a regenerating repeater which amplifies and shapes the obtained electric signal, an optical source which converts the electric signal into an optical signal, and a drive circuit which drives the optical source. The regenerating repeater consists of an equalizing amplifier, a timing extraction circuit and a decision circuit. By employing the first type of repeater, the compensation of attenuation and the removal of waveform distortion can be performed, but a large-scale and complicated circuit is necessary.

Second type of optical repeater employs an optical amplifier and directly amplifies an optical signal without converting it into an electric signal (refer to 'Hikari Tsushin' mentioned above, p. 264). When using a semiconductor laser as the optical amplifier, a laser driving current is maintained at a value just below a threshold level, whereupon when an input optical signal is injected into an active layer, optical amplification of the laser occurs to transmit an amplified optical signal. by employing this second type of repeater, a small-scale and simple circuit suffices, but existing waveform distortions cannot be removed because the input optical signal is amplified as it is and then transmitted.

SUMMARY OF THE INVENTION

An object of the present invention is to provide a system which can perform both the amplification and shaping of optical pulse signals directly without converting them into electric signals.

According to the present invention, especially for realizing the waveshaping function, a bistable laser is employed, and a drive current during normalcy biases the bistable laser to the middle point of the hysteresis region thereof. When input light exceeds a threshold level, the bistable laser is switched into the lasing state, and even when the input light thereafter disappears, the laser emits light of fixed intensity. A detector having detected this lasing state decreases the drive current temporarily after a predetermined period of time, to switch the bistable laser into the non-lasing state, whereby not only the amplification but also the shaping of an optical pulse signal is achieved.

When the bistable laser employed is a bistable semiconductor laser of the type having a plurality of segmented electrodes on one side, the lasing state can be detected from the voltage change of one of the plurality of electrodes, and hence, a system which is smaller and simpler is obtained.

According to the present invention, both the amplification and shaping of optical pulse signals can be performed directly without converting them into electric signals. Moreover, the system is small in size and simple in structure. These features are very useful as an optical repeater.

BRIEF DESCRIPTION OF THE DRAWINGS

In the accompanying drawings;

FIG. 6 is a time chart of the operation of the system in FIG. 2.

DETAILED DESCRIPTION OF THE PREFERRED EMBODIMENTS

Figure 1:
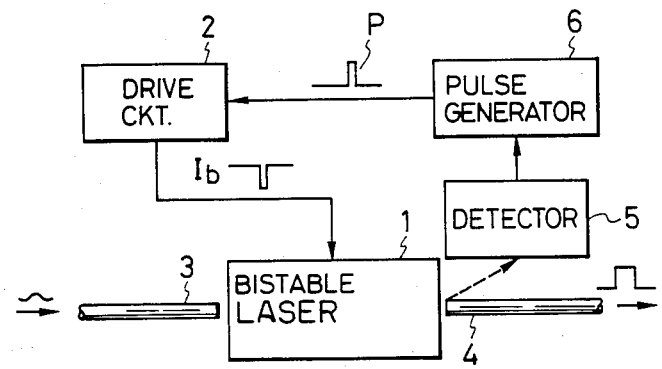
FIGS. 1 and 2 are block diagrams each showing an embodiment of the present invention.

FIG. 1 is a block diagram of one embodiment of the present invention. In normalcy, a bistable laser 1 is biased to the middle point of the hysteresis region thereof by a current $I_b$ supplied from a drive circuit 2. When light of or above a predetermined intensity is injected through an optical fiber 3, the bistable laser 1 is switched into the lasing state, and its output light is transmitted through an optical fiber 4. When a detector 5 has detected the lasing with a suitable mechanism for, e.g., monitoring the output light, it sends a signal to a pulse generator 6. The pulse generator 6 having received the signal sends a comparatively short pulse to the drive circuit 2 after a lapse of a period of time previously determined as a pulse duration. In response to the pulse, the drive circuit 2 drops its output current to below the threshold level of the laser 1 for the duration of this pulse. As a result, the laser 1 stops lasing and returns into the initial state, and an amplified and shaped rectangular pulse is produced as the output light.

Figure 2:
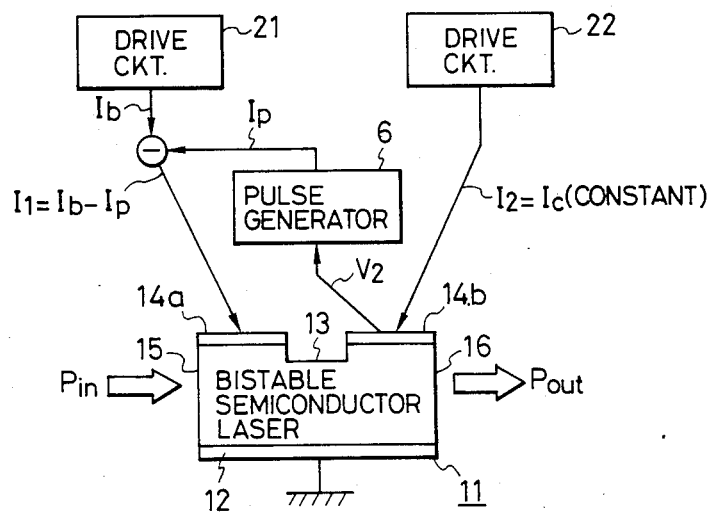
Figure 3:
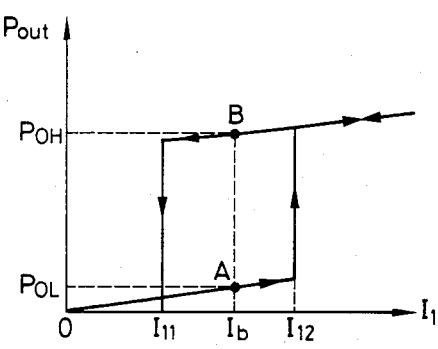
FIGS. 3 to 5 are characteristic diagrams of a bistable semiconductor laser in FIG. 2.
Figure 4:
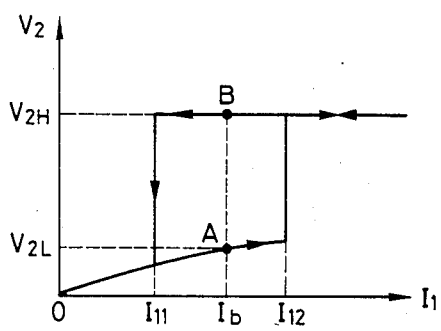
Figure 5:
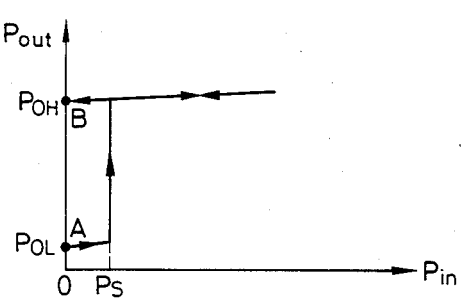

FIG. 2 shows an embodiment which employs a bistable semiconductor laser of the segmented electrode type. The bistable semiconductor laser 11 is one detailed in a thesis by C. Harder et al., 'IEEE Journal of Quantum Electronics', Vol. QE-18, No. 9 (1982), pp. 1351-1361. This semiconductor laser 11 has a single electrode 12 on one side, and has an electrode on the other side segmented into two electrodes 14a and 14b by an etched recess 13. When the values of the drive (injection) currents of the electrodes 14a and 14b are respectively denoted by $I_1$ and $I_2$ and the current $I_2$ is fixed to a suitable value $I_c$, the relationship between the optical output $P_{out}$ of the laser 11 and the drive current $I_1$ is as shown in FIG. 3. By applying the appropriate currents from the respective electrodes 14a and 14b in this manner, an optical amplifying section (under the electrode 14a) and a saturable absorbing section (under the electrode 14b) are formed. They interact to cause a hysteresis in the relationship between the drive current and the output light, and to bring forth an optical bistable function. In correspondence with the hysteresis in FIG. 3, the voltage $V_2$ of the electrode 14b to which the constant current is applied also exhibits a hysteresis characteristic as shown in FIG. 4 with respect to the current $I_l$. Further, when the current $I_l$ of the electrode 14a is fixed to $I_b$ in FIG. 3, the relationship between the power $P_{in}$ of injected light and the power $P_{out}$ of output light exhibits a hysteresis characteristic as shown in FIG. 5. The widths of these hysteresis, namely, a value $[I_{12}-I_{ll}]$ in FIGS. 3 and 4 and a value $P_s$ in FIG. 5 can be controlled by the value of the constant current $I_c$ which is injected from the electrode 14b.

In the arrangement of FIG. 2, a drive circuit 21 supplies the electrode 14a with a current $I_b$ in FIGS. 3 and 4, while a drive circuit 22 supplies the electrode 14b with the aforementioned constant current $I_c$. The input light is injected from one cleaved facet 15, and the output light is emitted from the other cleaved facet 16. Assuming the initial state lies at a point A in FIGS. 3-5, the optical output $P_{out}$ of the laser 11 is $P_{OL}$ (non-lasing state), and the voltage $V_2$ of the electrode 14b is $V_{2L}$. On this occasion, the pulse generator 6 is in the quiescent state thereof.

Now, a time chart in FIG. 6 will be also referred to, and optical pulses to be processed are assumed RZ signals having a duty ratio of 50%. When the value $P_{in}$ of input light having undergone attenuation and waveform distortion exceeds $P_s$ indicated in FIG. 5, the laser 11 oscillates. Even when the input light thereafter becomes below $P_s$, the laser stays in a state B. Meantime, the output light $P_{out}$ is substantially held at $P_{OH}$. On the other hand, the voltage $V_2$ of the electrode 14b changes from $V_{2L}$ to $V_{2H}$ as soon as the laser 11 shifts into the lasing state. In response to the voltage change, the pulse generator 6 produces a current pulse $I_p$ having an amplitude $I_p^O$ and a duration $t_p$ after $T/2$ (where T denotes a pulse period). The values of $I_p^O$ and $t_p$ are selected as follows:

$$0 < t_p < T/2$$

$$I_p^O < I_b - I_{11}$$

The current pulse $I_p$ is superposed on the current $I_b$ to be injected from the drive circuit 21 into the electrode 14a, in the opposite polarity. Accordingly, the value of the net current $I_l$ to be injected into the electrode 14a becomes $[I_b-I_p^O]$, which is smaller than $I_{11}$ (FIG. 3). Consequently, the laser 11 stops lasing after $T/2$ from the start of the lasing, and it returns into the initial state A when the pulse $I_p$ has vanished. The output light $P_{out}$ becomes a pulse shaped rectangular wave, which is amplified relative to the input light $P_{in}$ and which has the prescribed duty ratio (50%). A gain of amplification of 20 dB (100 times) or more can be expected.

As a modification of the embodiment in FIG. 2, the input light may be injected from the recess 13. Since, in this case, the output light emerges from both the cleaved facets 15 and 16, one output light is transmitted to the next stage, and the other output light can be utilized as monitor light in order to produce a feedback signal for stabilizing the operation of the laser 11. As an alternative method of switching the laser 11 into the non-lasing state, the current $I_2$ may be changed.

I claim:

1. A system for amplifying and shaping optical pulses comprising a bistable laser which has first and second light emission states based on hysteresis characteristics between a light emission output and a drive current and between the light emission output and injected light, a drive circuit which supplies said laser with a drive current corresponding to a middle point of the hysteresis characteristic thereof, detection means to detect that said laser has been switched from the first light emission state into the second light emission state by the injected light, and drive current control means to change the drive current after a predetermined time in response to an output of said detection means, thereby to switch said laser into the first light emission state, wherein said bistable laser is a semiconductor laser which has a plurality of segmented electrodes on one side thereof, said detection means is a means to detect a voltage change in one of said plurality of electrodes, and said drive current control means includes a pulse generator which changes the drive current for one of said plurality of electrodes.

2. A system for amplifying and shaping optical pulses as defined in claim 1, wherein the injected light is injected into said semiconductor laser from an interspace between said plurality of segmented electrodes, and further wherein said semiconductor laser includes two cleaved facets for emitting output light, the output light from a first cleaved facet being utilized to produce a feedback signal for stabilizing the operation of said semiconductor laser, and the output light from a second cleaved facet being utilized as an output of said system.

* * * * *